United States Patent
Pons et al.

(10) Patent No.: US 8,032,800 B2
(45) Date of Patent: Oct. 4, 2011

(54) SUBFRAME INTERLEAVING

(75) Inventors: Julien Pons, Eatontown, NJ (US); Amitkumar Mahadevan, Eatontown, NJ (US); Patrick Duvaut, Tinton Falls, NJ (US)

(73) Assignee: Ikanos Communications, Inc., Fremont, CA (US)

( * ) Notice: Subject to any disclaimer, the term of this patent is extended or adjusted under 35 U.S.C. 154(b) by 838 days.

(21) Appl. No.: 11/617,028

(22) Filed: Dec. 28, 2006

(65) Prior Publication Data
US 2007/0153838 A1 Jul. 5, 2007

Related U.S. Application Data

(62) Division of application No. 11/615,535, filed on Dec. 22, 2006.

(60) Provisional application No. 60/754,669, filed on Dec. 30, 2005, provisional application No. 60/771,885, filed on Feb. 10, 2006.

(51) Int. Cl.
*G06F 11/00* (2006.01)

(52) U.S. Cl. ......... 714/701; 370/464; 370/473; 711/157
(58) Field of Classification Search .................. 370/464, 370/465, 473; 711/100, 154, 157
See application file for complete search history.

(56) References Cited

U.S. PATENT DOCUMENTS

| | | | |
|---|---|---|---|
| 7,146,357 B2 * | 12/2006 | Suzuki et al. ..................... 707/3 |
| 7,450,645 B2 * | 11/2008 | Osorio et al. ............ 375/240.26 |
| 2002/0129314 A1 * | 9/2002 | Kim et al. ..................... 714/755 |
| 2006/0062314 A1 * | 3/2006 | Palin et al. ..................... 375/260 |
| 2007/0153838 A1 | 7/2007 | Pons et al. |

* cited by examiner

*Primary Examiner* — Hassan Kizou
*Assistant Examiner* — Siming Liu
(74) *Attorney, Agent, or Firm* — Thomas, Kayden, Horstemeyer & Risley, LLP

(57) ABSTRACT

Included are embodiments for subframe interleaving. At least one embodiment of a method includes receiving at least one subframe, the at least one subframe being derived from a plurality of frames of data and interspersing at least a portion of the at least one subframe according to a predetermined subframe interleaving strategy.

19 Claims, 13 Drawing Sheets

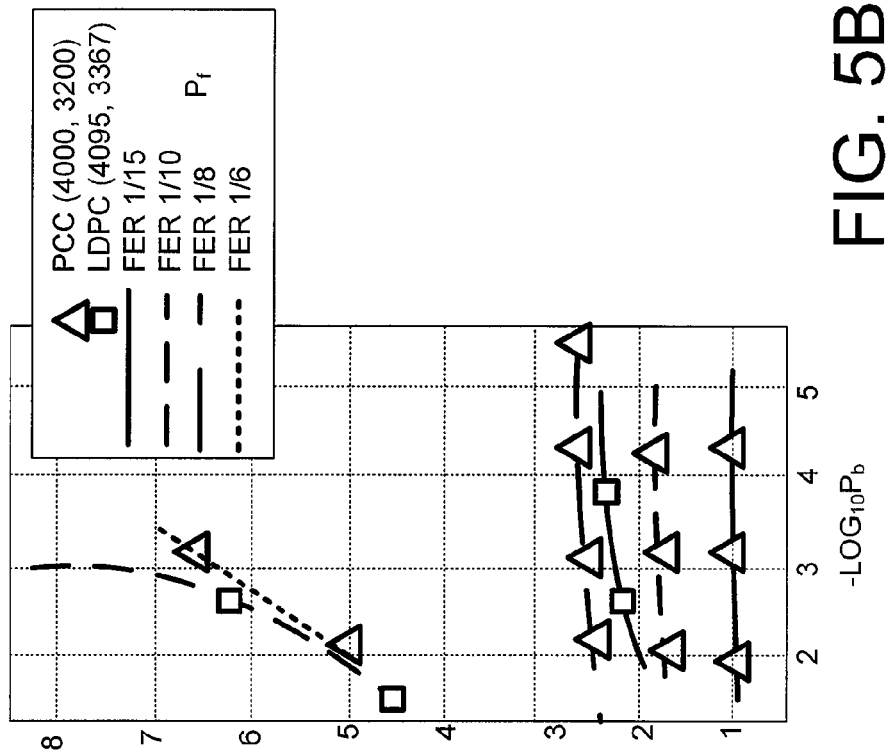
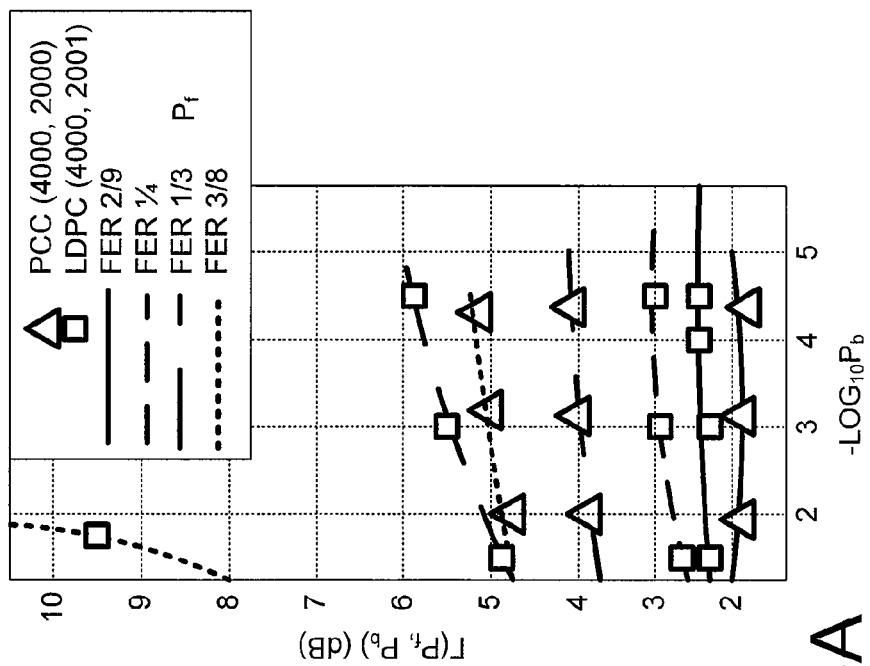
FIG. 5A
FIG. 5B

SUBFRAME INTERLEAVING

CROSS-REFERENCE TO RELATED APPLICATION

This application is a divisional of U.S. patent application Ser. No. 11/615,535, filed Dec. 22, 2006, which is hereby incorporated by reference in its entirety. This application also claims the benefit of U.S. Provisional Application No. 60/754,669, filed Dec. 30, 2005 and U.S. Provisional Application No. 60/771,885, filed Feb. 10, 2006, each of which are incorporated by reference in their entireties.

BACKGROUND

In many communications systems, disturbances may be received in a plurality of different forms. More specifically, a communications system may receive stationary noise and/or non-stationary noise. Stationary noise may include Additive White Gaussian Noise (AWGN) and/or other types of stationary noise. Non-stationary noise may include impulse noise and/or other noise that may cause a burst disturbance to a received signal.

Immunity to both stationary and non-stationary disturbances may be improved by using a "Signal to Noise Ratio (SNR) margin" (expressed in decibels (dB)), which may be configured to determine the available SNR overhead in case of a sudden increase in noise variance. Typical margin values, which may be in the range of a few dB, may become useless in the presence of these high-energy bursts. Classical techniques to protect coded systems against such interferences without the use of external codes employ channel interleaving to spread burst-errors, thereby improving the burst-error-correction capability. However, these techniques suffer from one or more technical drawbacks.

Thus, a heretofore unaddressed need exists in the industry to address the aforementioned deficiencies and inadequacies.

SUMMARY

Included are embodiments for subframe interleaving. At least one embodiment of a method includes receiving at least one subframe, the at least one subframe being derived from a plurality of frames of data and interspersing at least a portion of the at least one subframe according to a predetermined subframe interleaving strategy.

Also included are embodiments of a subframe interleaver. At least one embodiment includes a receiving component configured to receive at least one subframe, the at least one subframe being derived from a plurality of frames of data and a first determining component configured to determine whether a total number of received subframes exceeds a predetermined threshold. Some embodiments include an interspersing component configured to, in response to determining that the total number of received subframes exceeds the predetermined threshold, intersperse at least a portion of the at least one subframe according to a predetermined subframe interleaving strategy.

Other systems, methods, features, and advantages of this disclosure will be or become apparent to one with skill in the art upon examination of the following drawings and detailed description. It is intended that all such additional systems, methods, features, and advantages be included within this description and be within the scope of the present disclosure.

BRIEF DESCRIPTION

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, there is no intent to limit the disclosure to the embodiment or embodiments disclosed herein. On the contrary, the intent is to cover all alternatives, modifications, and equivalents.

FIGS. 5A and 5B are exemplary graphical representations of power, such as Signal to Noise Ratio (SNR) margin, as a function of bit error probability for an Orthogonal Frequency Domain Multiplexing (OFDM) system.

DETAILED DESCRIPTION

Figure 1:
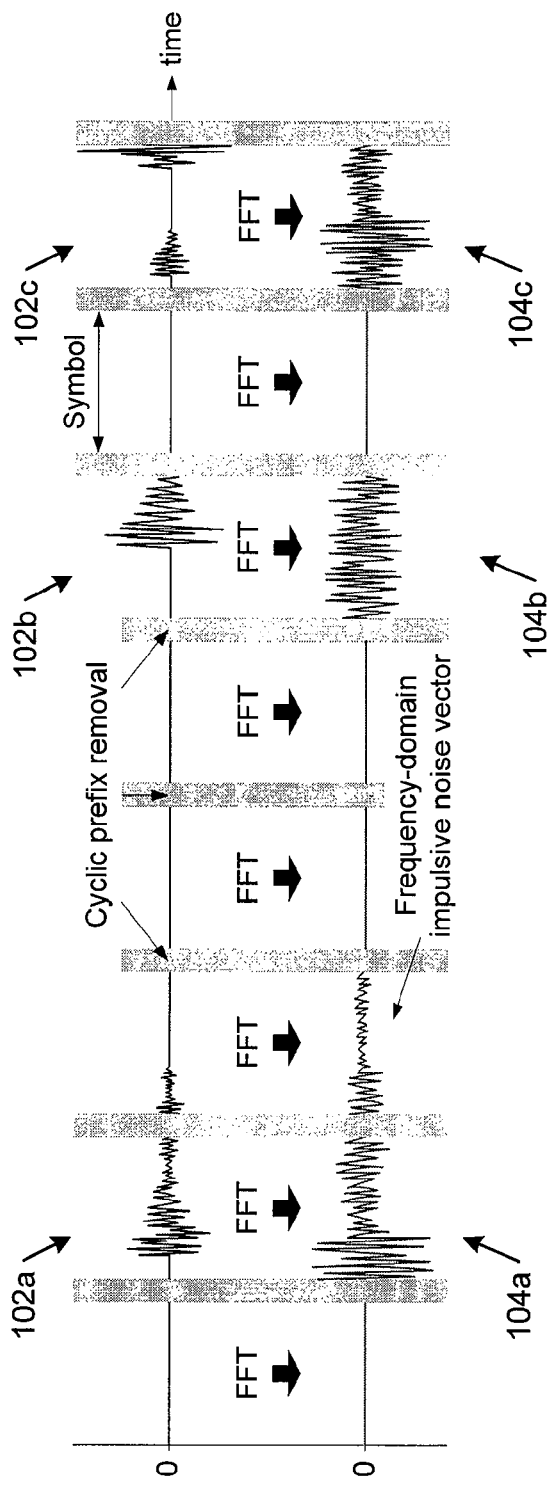
FIG. 1 is an exemplary embodiment of noise in a time domain and in a frequency domain.

Included are systems and methods for self-protection against non-stationary disturbances with a single Parallel Concatenated Convolutional (PCC), or Low-Density Parity Check (LDPC) code and/or other codes. Self-protection may include the ability to correct a mixture of random-errors and burst-errors to achieve an output Bit Error Rate (BER) that is below a specified target without using additional coding. Such systems may be configured to efficiently utilize an available Signal to Noise Ratio (SNR) margin. Additionally included are embodiments of a self-protection unit that that may be configured for erasure-decoding, subframing and subframing interleaving operability.

Systems using a multicarrier modulation scheme, such as Orthogonal Frequency Division Multiplexing (OFDM) and Discrete MultiTone (DMT) modulation schemes, may be sensitive to burst noise since a burst corrupting a few time-domain samples may spread across subcarriers of a corresponding multicarrier symbol after a conversion from time-domain to frequency domain.

As a nonlimiting example, for a system using an OFDM or DMT modulation, a burst signal that corrupts one or more time-domain samples may spread across subcarriers of a corresponding OFDM and/or DMT symbol when a Fast Fourier Transform (FFT) operation is performed at a receiver. Hence, the burst length after an FFT operation may equal an integer multiple of the symbol length (see for example, FIG. 1).

Additionally, burst errors may be associated with an energy level that is significantly higher than the SNR margin. Consequently, the entire symbol affected by a burst may be severely corrupted. Such symbols carry very little information to help a decoder, and may be erased.

Assuming perfect synchronization and equalization, the equivalent frequency-domain channel model that jointly accommodates random- and burst-errors may be represented by a memory-less channel disturbed by two noise sources: 1) a stationary background Additive White Gaussian Noise (AWGN), and 2) non-stationary Symbol-Erasures (SE) corresponding to frequency-domain bursts, called error events. For each symbol k, the channel input maybe represented by a vector $X_k$ where each element corresponds to the constellation signal transmitted per subcarrier. The channel output is then a vector $y_k$ as defined in expression (1):

$$y_k = \begin{cases} * & \text{if symbol } k \text{ is corrupted} \\ a \odot x_k + n_k & \text{otherwise,} \end{cases} \quad (1)$$

where $\odot$ stands for the element-by-element vector product, the vector a denotes the attenuation per subcarrier, $n_k$ is a white Gaussian noise vector with zero mean and variance $\sigma^2$, and * represents a symbol-erasure.

More specifically, in at least one exemplary embodiment, the channel coding process is assumed to be such that a codeword (often referred to as a frame) may be composed of an integer number $\eta$ of symbols. Based on the channel model, a WC-AWGN-SE channel may be introduced to evaluate the ability of a coded multicarrier system to correct isolated worst-case error events corrupting "$\alpha$" consecutive symbols. An isolated worst-case error event may include scenario where an arrival time between two error events is sufficiently large so that no more than one error event affects a single frame. Thus, a WC-AWGN-SE ($\eta$, $\alpha$, $\sigma^2$) channel may be configured to assume that each frame comprised of $\eta$ symbols has $\alpha$ (integer) contiguous symbol-erasures. Since $\alpha$ may be an integer, a frame can be corrupted by a limited number $\eta-\alpha+1$ of distinct length-$\alpha$ error events uniformly located in the length-$\eta$ frame. The location of symbol-erasures is assumed to be known by the decoder, which is practically valid for OFDM systems. The ratio $P_f=\alpha/\eta$ is defined as the frame erasure rate (FER).

As a nonlimiting example, a fully coded OFDM system may be configured to transmit data over a WC-AWGN-SE ($\eta$, $\alpha$, $\sigma^2$) channel. Assuming that the location of symbol erasures is available at the decoder, some techniques to improve the system performance without additional coding combine erasure decoding and channel interleaving whose functions are distinct.

Erasure-decoding may include setting to zero the log-likelihood metrics (sent to the decoder) of bits associated with symbol-erasures. Given the design decoder output BER $P_b$ in a pure AWGN($\sigma^2$) environment, it is usually (but not always) possible to maintain $P_b$ in a WC-AWGN-SE ($\eta$, $\alpha$, $\sigma^2$) environment by increasing the signal power by the amount $\Gamma(P_f, P_b)$. Given the uniform occurrence probability of error events in a WC-AWGN-SE environment, $\Gamma(P_f, P_b)$ is obtained by averaging the SNR degradation (relative to the AWGN performance) due to simultaneously erasing the $\alpha N/\eta$ contiguous bits with indices $(\zeta-1)N/\eta+1$ to $(\zeta+\alpha-1)N/\eta$ in the N-bit frame, for all starting locations $\zeta \in \{1, \ldots, \eta-\alpha+1\}$ of error events. Therefore, a configuration with an SNR margin $\Gamma_s$ can achieve a decoder output BER of $P_b$ in a WC-AWGN-SE ($\eta$, $\alpha$, $\sigma^2$) environment as long as $P_f \leq P_{f,max}$, where $P_{f,max}$ is the maximum value $P_f$ yielding $\Gamma(P_f, P_b) \leq \Gamma_s$.

If $P_f > P_{f,max}$, erasure-decoding is insufficient to ensure a BER of $P_b$ with the SNR margin. In this case, channel interleaving may be used, which involves reordering the bits of each original frame into an integer number $D \geq 1$ of frames in order to reduce the number of contiguous corrupted bits per frame. Hence, if an error event affects a frame in the channel, the error may actually corrupt non-contiguous bits spread across D different original frames, in which the number of erasures may be reduced by a factor of approximately D. For D=1. Although the original FER $P_f$ remains unchanged, the effect of interleaving the bits in a frame may reduce $\Gamma(P_f, P_b)$, thereby increasing $P_{f,max}$. D is called the interleaving depth. Two classes of channel interleavers may be used in communications systems: random channel interleaver and convolutional channel interleaver.

A random channel interleaver (RCI) may be configured to randomly interleave the coded sequence in order to spread and randomize corrupted bits into D frames. Since PCC and LDPC codes may be designed to effectively correct random-errors, random interleaving represents a good solution to improve the erasure correction capability per frame $P_{f,max}$, (e.g., to lower $\Gamma(P_f, P_b)$). However, given its block structure, the RCI may introduce an extra latency equal to twice the delay of transmitting D-1 frames and also requires the interleaving pattern to be stored.

A Convolutional Channel Interleaver (CCI) is a synchronous interleaver that cyclically spreads error events. The CCI is particularly advantageous in applications that only demand improved spreading capabilities, since the CCI can achieve the minimum possible latency (half that of the RCI) with a minimum storage capacity. The CCI does not require storage for an interleaving pattern. However, given its periodic deterministic interleaving pattern, the CCI does not randomize the location of corrupted bits, hence does not guarantee an erasure-decoding performance as good as that obtained with the combination of erasure-decoding and RCI of similar depth.

Self-protected systems may be configured for erasure-decoding with an enhanced channel interleaver that combines the high erasure correction capability of the RCI with the low latency and storage capacity of the CCI. A new channel interleaver may be formed by the serial concatenation of a subframer 204 and a subframe interleaver 206, whose operations are detailed below.

Referring now to the drawings, FIG. 1 is an exemplary embodiment of noise in a time domain and in a frequency domain. More specifically, as illustrated in the nonlimiting example of FIG. 1, in receiving a multi-carrier signal, noise 102a, 102b, and 102c may be received in the time domain. As illustrated, noise signal 102a may span a plurality of symbols. Noise signals 102b and 102c may each span only a portion of a symbol. However, when the signal is transformed from the time domain to the frequency domain, the noise is also transformed. As illustrated, noise 102a is transformed into a frequency-domain impulse vector 104a that spans two full symbols. The noise signal 102b is transformed into a frequency-domain impulse noise vector 104b that spans a full symbol. The noise signal 102c is transformed into a frequency-domain impulse noise vector 104c that also spans a full symbol. As transforming the signal from the time domain to the frequency domain also transforms noise on that signal, a Self-Protection Unit (SPU) may be utilized to reduce the effects of the noise.

Figure 2:
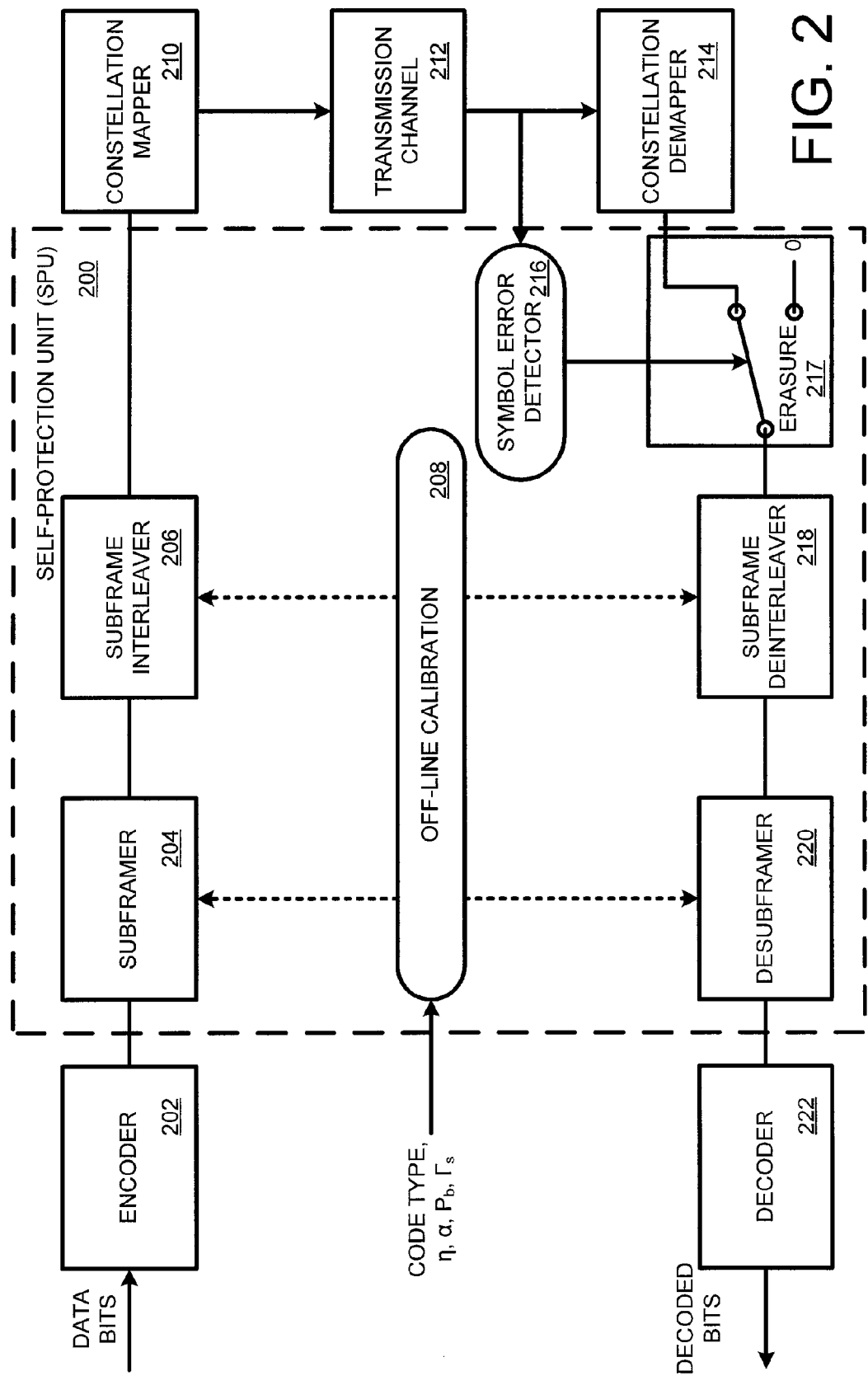
FIG. 2 is an exemplary embodiment of a self-protection unit, which may be used to reduce effects of stationary and/or non-stationary noise.

FIG. 2 is an exemplary embodiment of a self-protection unit, which may be used to reduce stationary and/or non-stationary noise. More specifically, as illustrated, an encoder 202 may receive data bits for processing. The encoder may encode the received data and send the encoded data to a subframer 204 of the Self-Protection Unit (SPU) 200. The subframer may receive the encoded data as code words in frames, where each frame may include a plurality of bits (and/or bytes), such as, for example 255 bytes. The subframer may be configured to divide the received frames into a plurality of sub-frames, where one or more of the subframes may be configured as a subset of a received frame.

Subframing may include reordering the elements of a single frame in order to reduce the SNR degradation $\Gamma(P_f, P_b)$, thereby increasing $P_{f,max}$. Depending on the particular configuration, subframing may be completed in two steps. First, the subframer 204 may determine a set of N/η-bit subsets $F_1$, $i \in \{1, \ldots, \eta\}$ of the frame F, such that $$F_i \cap F_j = \emptyset, \forall \{i, j \neq i\} \in \{1, \ldots, \eta\}^2 \text{ and } F = \bigcup_{i=1}^{\eta} F_i$$

such that the average SNR degradation due to simultaneously erasing all bits of the sets $$\bigcup_{i=\zeta}^{\zeta+\alpha-1} F_i, \forall \zeta \in \{1, \ldots, \eta - \alpha + 1\}$$

is reduced (compared to erasing αN/η contiguous bits in the frame.

Second, the original frames may be reordered so that all bits in $F_i$ are contiguous in the reordered frame, which comprises η contiguous blocks, called subframes, respectively containing the bits in the subsets $F_1$ to $F_\eta$. The reordering of the original frame into subframes is dictated by a so-called subframing pattern, noted $S_\eta^\alpha$.

Subframing does not modify the system latency, which may be configured to equal (or substantially equal) the delay to encode and decode a frame (2η symbol times). However, both transmitter and receiver may be utilized to store the subframing pattern and the reordered frame. The choice of subsets $F_i$'s to maximize $P_{f,max}$ depends on the structure of the code. Various embodiments of this disclosure may be configured to provide a memory efficient approach to determine a set of $F_i$'s that both increases $P_{f,max}$ and yields a cyclic subframing pattern of small period, hence utilizing small storage capacity.

By increasing $P_{f,max}$, subframing can maintain $P_b$ with a higher FER $P_f$ without interleaving several frames together. If $P_f \leq P_{f,max}$, each subframe may be mapped to a symbol transmitted over the WC-AWGN-SE channel. However, in the case $P_f > P_{f,max}$, subframing may be insufficient and the use of additional techniques, such a subframe interleaving, may be utilized.

A subframe interleaver 206 may also be included in the Self-Protection Unit 200 and may be configured to receive the subframes from the subframer 204. The subframe interleaver 206 may also be configured to interleave the received subframes to reduce the effect of impulse noise on a signal. More specifically, as discussed in more detail below, as impulse noise may span the length of one or more subframes. In order to reduce the number of subframes associated with any given frame that are affected by received impulse noise, at least one embodiment may be configured to interleave and/or otherwise rearrange the subframes. In such a configuration, received impulse noise may span the length of a plurality of subframes, however, since the subframes are interleaved, only a fraction of the subframes associated with a given frame are affected. This may enhance the performance of a decoder 222 and/or other components illustrated in FIG. 2.

The interleaved subframes may be sent from the subframe interleaver 206 of the Self-Protection Unit to a constellation mapper 210. The constellation mapper 210 may be configured to map bits of the subframes to the same OFDM symbol, as discussed in more detail, below. The mapped data may then be sent to a transmission channel 212. The transmission channel 212 can be configured to evaluate the performance of the system. One should note that transmission channel 212 can be a wireless channel, wireline channel, and/or other channel for evaluating the performance of the system.

Additionally the transmission channel 212 may send the data to a constellation demapper 214 for demapping the data. The demapped data is sent to a subframe deinterleaver 218, which may be configured to deinterleave the received data. Additionally, a symbol error detector 216 may be included and configured to flag a confidence signal associated with the accuracy of the received data. Upon deinterleaving, the data may be sent to a desubframer 220 to return the subframes back to a frame format. The data may then be sent to a decoder 222. Additionally, an off-line calibration component 208 may be configured to receive a code type and (among other things) determine a distance in time between subframes.

Figure 3:
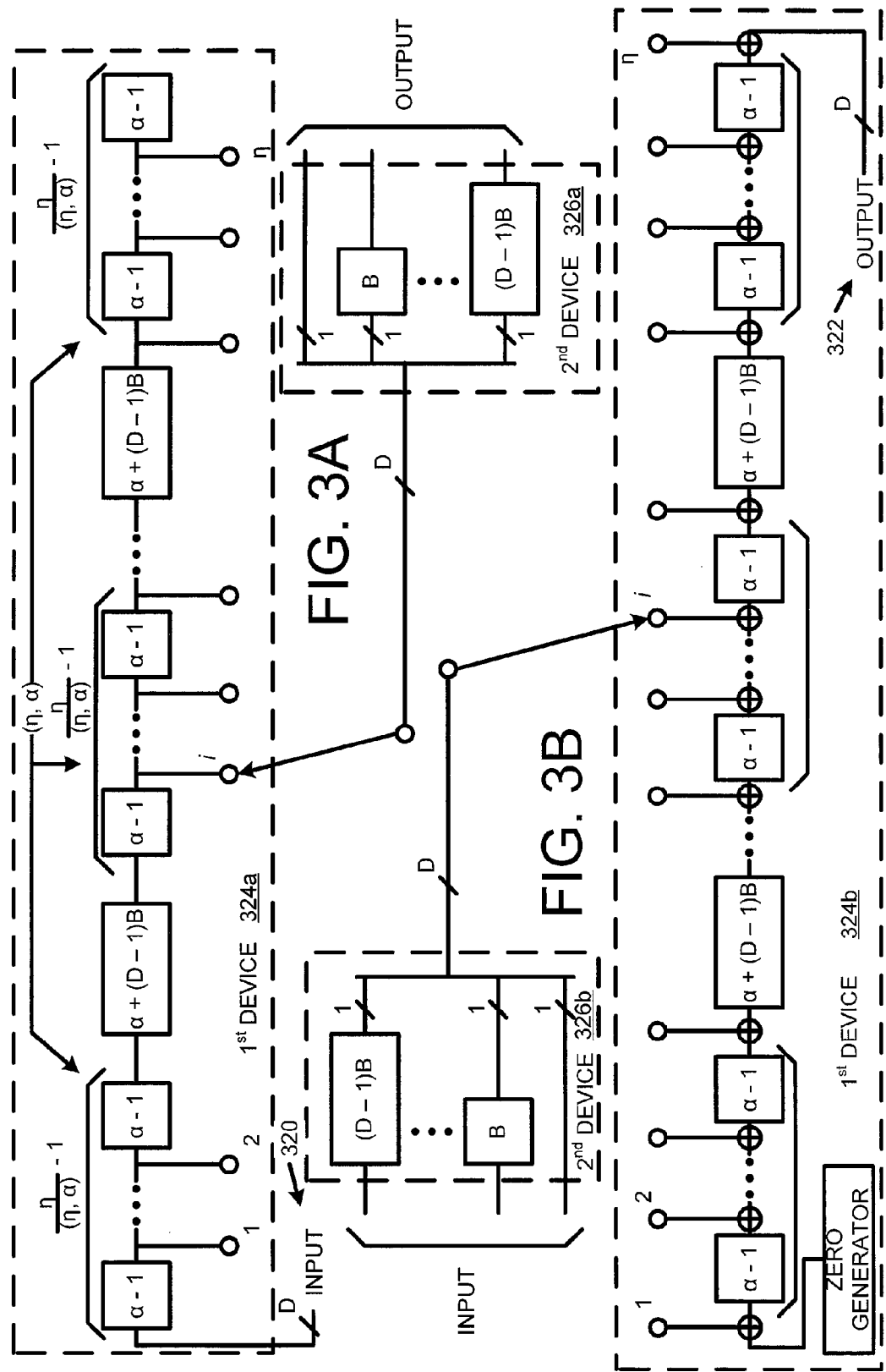
FIG. 3A is an exemplary embodiment of a subframe interleaver, such as may be utilized in the self-protection from FIG. 2.
FIG. 3B is an exemplary embodiment of a subframe deinterleaver, similar to the subframe interleaver from FIG. 2A.

FIG. 3A is an exemplary embodiment of a subframe interleaver, such as may be utilized in the self-protection from FIG. 2. As illustrated, the subframe interleaver 206 can receive a plurality of sequential subframes at input 320.

More specifically, in at least one nonlimiting example, subframe interleaving may be introduced to spread isolated error events over several subframes associated with distinct original frames, thereby reducing the original FER $P_f$. The subframe interleaver 206 may be configured to operate on subframes and may be used for a spreading capability via a convolutional structure. Any of a plurality of subframe interleaving techniques may be utilized, a plurality of which are discussed below.

A first interleaving technique, inspired by Forney's approach, may involve 1) reordering according to the subframing pattern $S_{D\eta}^\alpha$ each frame in Dη subframes, where $D = \lceil \alpha/\eta P_{f,max} \rceil$, and 2) interleaving subframes so that each symbol includes at most a single subframe from a specific frame. The original FER $P_f (=\alpha/\eta)$ may then be reduced by a factor D. This technique may be configured to introduce a minimum extra latency of $$\left(\left\lceil \frac{\alpha}{\eta P_{f,max}} \right\rceil - 1\right)\eta$$

symbol times.

In a second Interleaving technique, each original frame may be reordered into $D\eta$ subframes according to $S_{D\eta}^{1}$, where $D = \lceil 1/\eta P_{f,max} \rceil$. The subframes are then interleaved so that no contiguous sequence of $\alpha$ symbols contains more than one subframe taken from the same original frame. A convolutional interleaver may be utilized and configured to realize such interleaving and introduce an extra latency equal to (in symbol times)

$$\left(\left\lceil \frac{1}{\eta P_{f,max}} \right\rceil \eta - 1\right)\alpha - \eta + (\eta, \alpha),$$

where $(\eta, \alpha)$ denotes the greatest common divisor of $\eta$ and $\alpha$.

Given the parameters $\{\eta, \alpha, P_{f,max}\}$, in various embodiments, one may select the technique (first or second, described above) that yields the lowest latency. Thus, subframe interleaving introduces at most an extra latency equal to that of the classical CCI. When the equations above produce equal (or substantially equal) results, the second technique may be selected since this algorithm interleaves fewer subframes, thus requiring less memory and less latency. In many embodiments, $D\eta \ll N$, hence the storage capacity of the subframe interleaver 206 ($D\eta$ subframe indices) may be almost negligible compared to that of a bit-CCI (N bits). The bits in each subframe may be stored in the subframer 204.

By using subframe interleaving of depth D, a length-$\alpha$ error event corrupts at most D if the first technique is utilized (or $\alpha$ D if the second technique is utilized) different original frames if the interleaving techniques described above are used. Therefore, to be capable of maintaining the target BER of $P_b$ for $D \neq 1$, the transmission channel 212 may be configured to assume $D\eta$ (first technique) and $\alpha D\eta$ (second technique) symbols per frame (e.g., an increased arrival time between error events) depending on which interleaving technique is used.

FIG. 3B is an exemplary embodiment of a subframe deinterleaver, similar to the subframe interleaver from FIG. 2A. More specifically, as illustrated in the nonlimiting example of FIG. 3B and discussed in more detail below, the subframe deinterleaver may be configured to receive a plurality of subframes from the erasure component 217 and deinterleave the received subframes according to the previously determined strategy. The subframe deinterleaver may output deinterleaved subframes to desubframer 220 via output 322.

Figure 4:
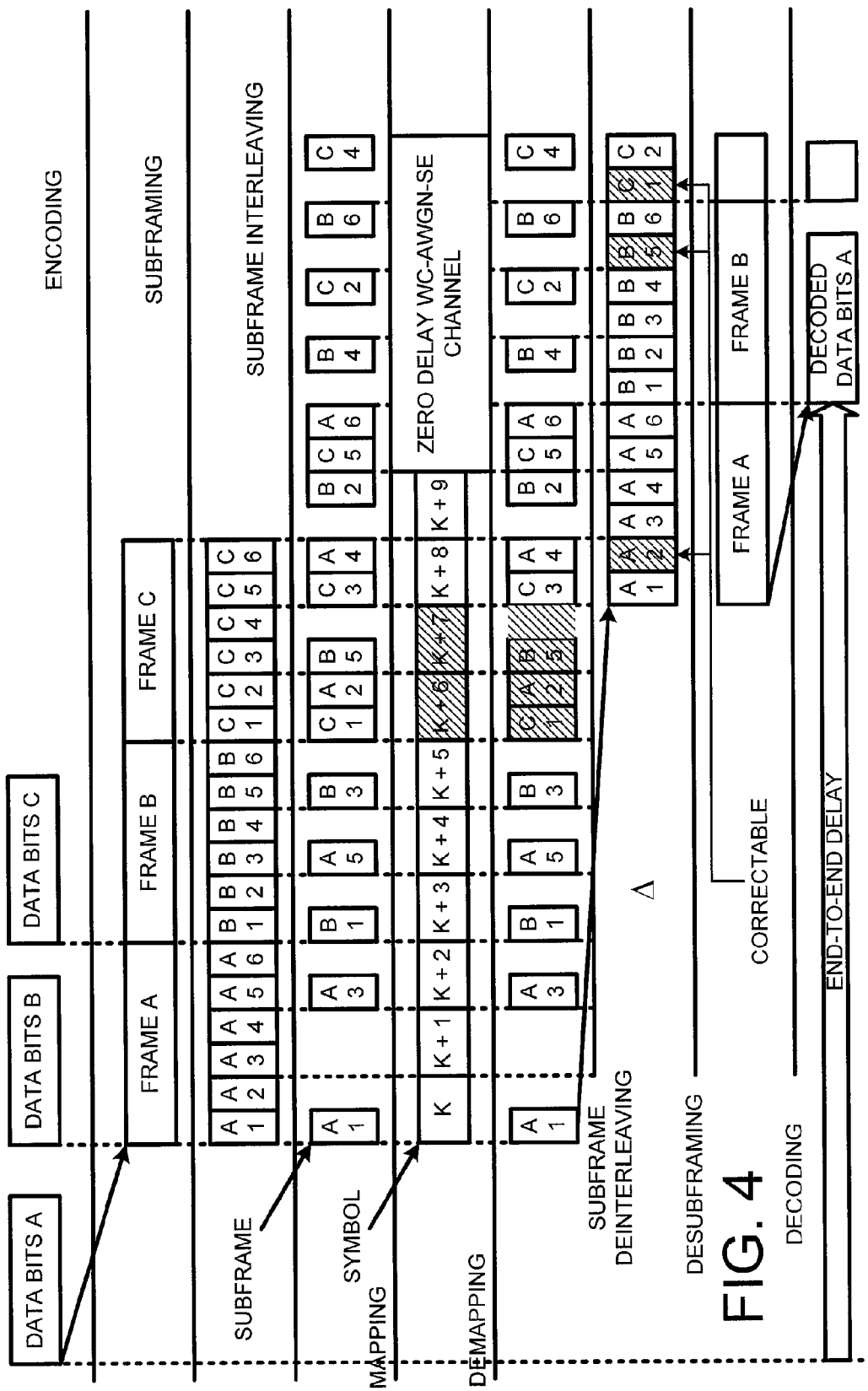
FIG. 4 is a datagram of a self-protected system with parameters, using a subframe interleaving technique, such as in the self-protection unit from FIG. 2.

FIG. 4 is a datagram of a self-protected system with parameters, using a subframe interleaving technique, such as in the self-protection unit from FIG. 2. More specifically, with respect to the Off-line calibration 208, given the code (type, $\eta$), the SNR margin $\Gamma_s$ and the target BER $P_b$, one may first determine $P_{f,max}$. If $P_f \leq P_{f,max}$, set D=1, select $S_\eta^\alpha$ from a table (that stores the patterns $S_\eta^\alpha$ for various combinations $\{\eta, \alpha\}$) and bypass the subframe interleaver. Otherwise, one may select the subframe interleaving technique yielding the lowest latency, compute D, and then select $S_{D\eta}^\alpha$ (first interleaving technique) or $S_{D\eta}^{1}$ (second interleaving technique) from a table.

During a transmission mode after encoding, each frame may be reordered according to $S_{D\eta}^\alpha$ (first interleaving technique) or $S_{D\eta}^\alpha$ (second interleaving technique) into $D\eta$ subframes with labels in $\{1, \ldots, D\eta\}$. The subframes may then be interleaved using the selected technique (first or second). Finally, the D interleaved subframes forming each symbol k may be mapped (via constellation mapper 210 (FIG. 2)) to a vector $x_k$ transmitted over the channel 212 (FIG. 2). At a receiver of the SPU 200, if the received vector is corrupted ($y_k = *$) (represented by the hatched area in FIG. 4), all metrics associated with the symbol k may be erased via eraser 217, otherwise the metrics are computed assuming a pure AWGN with zero mean and variance $\sigma^2$. Finally, subframes may be deinterleaved, via subframe deinterleaver, 218 (FIG. 2) and desubframed, via desubframer 220 (FIG. 2) into the original bit-ordering, before decoding.

As codes designed to correct random errors are also likely to perform well in the presence of random erasures, a reasonable model to tackle channel erasures might involve randomly distributing the erasures throughout the frame. Thoroughly, the concept of random erasures can serve as a basis for a reference subframing strategy, which may include random subframing. Random subframing may include randomly reordering the original coded bit sequence into $\eta$ complementary subframes. Although random subframing yields fairly good performance for both PCC and LDPC codes, the technique may require storing the N-bit subframing pattern. Thus, various embodiments may be configured to provide deterministic subframing strategies for PCC and LDPC codes that are nearly as effective in performance as random subframing in terms of $P_{f,max}$, but that reduce the storage capacity for the subframing pattern.

At least one exemplary embodiment may utilize a rate-R PCC Code ($R \geq 1/3$) obtained by puncturing a rate-1/3 PCC code. When using an iterative a posteriori probability decoder, the systematic, non-interleaved parity, and interleaved parity bits (respectively denotes as $s_n$, $p_n$, $n \in \{1, \ldots, N\}$) may have different levels of importance. Given the high importance of systematic bits and the regular trellis structure, one exemplary embodiment involves cyclically, puncturing only the two parity sequences so that punctured elements are:
1) alternately and equally distributed in both sequences, and
2) well scattered in each sequence.

Puncturing bits at the transmitter yields similar performance to erasing the same bits at the receiver. Consequently, a system using subframing dictated by $S_\eta^\alpha$ is equivalent to a system punctured by $\alpha$ constant puncturing patterns (CCP's) uniformly selected from a set of $\eta$ CPP's that respectively puncture all bits contained in each subset $F_i$, following by transmitting over an AWGN ($\sigma_2$) channel. Thus, a good set of $F_i$'s is given by a set of CPP's jointly optimized to lower the SNR degradation in an AWGN environment. The joint determination of CPP's is slightly different from the puncturing strategy stated in the previous paragraph. By extending this strategy to the three sequences, a good subframing technique (referred to herein as "strategy 2") may be provided by first, alternately and equally distributing systematic, parity, and interleaved parity bits to subframes. Next, the coded bits generated by the same data bit may be distributed into different subframes. Third, for each coded sequence, all bits allocated to the same subframe may be scattered in the original ordering. Fourth, the subframes are complementary.

At least one cyclic subframing pattern with a small period that is as effective as random patterns can be constructed using the strategy 2. The same cyclic pattern $S_\eta^\alpha$ can be used for any $\alpha$. However, the $\eta$ subframe indices should be permuted to minimize the average SNR degradation due to uniformly erasing $\alpha$ subframes with contiguous indices.

As a nonlimiting example, the rate-R=½ PCC code may be configured to generate an originally ordered coded sequence ($s_1$, $p_1$, $s_2$, $p_2$, $s_3$, $p_3$, ...). For η=4, a good 16-periodic subframing pattern determined via the second strategy is given by $S_4^\alpha$=[1234214213312443]. The subframer can be realized with a η-position commutator distributing the $\eta^{th}$ coded bit, ηϵ{1, ..., N} to the subframe with index $S_4^\alpha$(η %16), where % denotes the modulo operator.

Thus far, two different subframe interleaving techniques have been suggested without proving the existence of interleaver devices that achieve desired latencies. Below is a discussion of a convolutional subframe interleaver that achieves the desired latencies with a reduced (even minimum, in some cases) storage capacity. The generic structures of the subframe interleaver 206 and deinterleaver 218 are depicted in FIG. 2. The interleaver 206 is formed by the serial concatenation of two interleaver devices. The symbol interleaver, is inspired by Ramsey's type I/III interleavers and may be configured to interleave the subframer 204 output symbols (whose length may be equal to that of an OFDM symbol), where a symbol may include a multicarrier symbol. The second device is a periodic interleaver that interleaves the subframes associated with each output symbol of the first interleaver. For the sake of storage, both devices interleave the subframe indices assuming that the data contained in each subframe is contiguously stored in memory.

The interleaver parameters differ with respect to the selected interleaving technique (first or second). The first Interleaving technique is simpler to implement and can be realized with a single periodic interleaver device. Consequently, as discussed below, both interleaver devices forming the subframe interleaver are detailed while assuming that the second interleaving technique is selected. The possibility of interleaving according to the first technique with the structure given in FIG. 2 is discussed below.

The interleaver may be formed by a serial concatenation of two interleaver devices. The first device, called a symbol interleaver, is inspired by Ramsey's type I/III interleavers and interleaves the subframer output symbols. The second device is a periodic interleaver that interleaves the subframes associated with each output symbol of the first interleaver.

The symbol interleaver is formed by a $\Delta_1$-stage shift register and a η-position commutator that are both clocked every OFDM symbol time. Each stage of the shift register stores the D subframe indices associated with each symbol output of the subframer. The total number of stages is given by $\Delta_1$=(Dη−1)α−η+(η, α)−(D−1)B, where $$B = \frac{\alpha\eta}{(\eta, \alpha)}.$$

Given the label iϵ{1, ..., η} of a symbol in each frame (i=1+(k−1)% η), the $i^{th}$ symbol is delayed by $\sigma_i$ symbols, where $\sigma_i$ is given by the recursive formula $$\sigma_1 = 0$$

$$\sigma_i = \sigma_{i-1} + \begin{cases} \alpha - 1 & \forall_i > 1, \left\lfloor \frac{i-1}{(\eta,\alpha)} \right\rfloor = \left\lfloor \frac{i-2}{(\eta,\alpha)} \right\rfloor \\ \alpha + (D-1)B & \text{otherwise} \end{cases}$$

The shift register has η outputs, labeled i, which respectively corresponds to the outputs of the $\sigma_i^{th}$ register stages and are η-periodically sampled by the commutator. Unlike Ramsey's structure, the outputs are not evenly distributed in the shift register, which yields a more complex commutation sequence, that is: the $i^{th}$ output is sampled when the shift register inputs the symbol with label 1+(i+$\sigma_i$−1)% η, for all iϵ{1, ..., η}.

As discussed above, the symbol (first device) deinterleaver is inspired by Ramsey's type II/IV unscramblers and is formed by a shift register and a commutator similar to those used in the symbol interleaver, where the commutation is performed in the same order as in the interleaver 206.

As illustrated, the first device interleaving-deinterleaving latency may be configured to equal the maximum delay introduced by the interleaver 206, (e.g., equals $\Delta_1$). Similar to type I-to-IV interleavers, since each shift register stores $\Delta_1$ symbols, the combined storage capacity of both symbol interleaver and deinterleaver devices 2 $\Delta_1$ symbols, which corresponds to twice the minimum possible storage capacity. Although a storage-reducing technique (minimizing the storage capacity to $\Delta_1$ symbols) similar to that proposed by Ramsey in J. L. Ramsey, "Realization of optimum interleavers," IEEE Trans. Inform. Theory, vol. 16, no. 3, pp. 338-345, May 1970, which is hereby incorporated by reference in its entirety, is applicable to the symbol interleaver, the storage reduction is not discussed in this paper for brevity. The symbol interleaver, in this particular nonlimiting example, has no restrictions on the values of η, D and α.

Once a symbol is interleaved, the D constituent subframes may be interleaved by a BD×D periodic subframe (second device) interleaver. The periodic subframe interleaver may be formed by a bank of D parallel delayed lines, where the $j^{th}$ subframe, jϵ{1, ..., D} delays the $j^{th}$ subframe constituting each input symbol (through a (j−1)B-stage shift register clocked every symbol. At each symbol time k, the D delayed lines output the D subframe-indices associated with the transmitted symbol $x_k$. The associate periodic deinterleaver may have a structure similar to that of the interleaver, except that the delay of the $j^{th}$ line equals (D−j)B symbol times. The latency of the periodic interleaver-deinterleaver, noted $\Delta_2$, equals (D−1)B symbol times. The storage capacity of the periodic interleaver (and deinterleaver) may be minimum.

Assuming that the second interleaving technique is selected, the latency Δ of the subframe interleaver-deinterleaver depicted in FIG. 2 equals $\Delta_1+\Delta_2$=(Dη−1)α−η+(η, α) symbol times. A lower bound on the interleaving-deinterleaving delay, noted $\Delta_{min}$ (expressed in symbol times), may be achieved when a contiguous sequence of α symbols in the interleaved sequence contains subframes associated with α D contiguous frames, yielding $\Delta_{min}$=(Dη−1)α−η+1. One should note that $\Delta_{min}$ assumes no overlap between interleaved subframes, thus, this may not be achievable for all sets {η, D, α}. At the very least, however, Δ may be a minimum when η and α are relatively prime, since $\Delta_{min}$ is achieved.

Assuming that the first interleaving technique is selected, the subframe interleaver given in FIG. 2 can be simplified to the single periodic subframe interleaver (in at least one exemplary embodiment, second device only, no first device symbol interleaver is required) with B=η, by setting B=η and forcing the commutator of the symbol interleaver to sample the register output 1 for all i, thereby passing the symbol interleaver. Since $\Delta_1$=0, the subframe interleaving latency is given by Δ=$\Delta_2$=(D−1)η.

A goal of the various embodiments of this disclosure is to present good memory-efficient subframing strategies that can be generally applied to any PCC or LDPC code. For both PCC and LDPC codes, such optimization may depend on the code structure and would involve joint consideration of the subframing pattern with the code structure. For instance, for systems using PCC codes, the subframing pattern can be optimized to maximize the minimum output weight and/or minimize the multiplicity of low weight codewords of the equivalent punctured system.

FIGS. 5A and 5B present simulation results for two different OFDM systems transmitting QPSK signals per subcarrier over a WC-AWGN-SE ($\eta$, $\alpha$, $\sigma^2$) channel, which are respectively coded with a rate-R=½ and ⅘ PCC code. Each PCC encoder is formed by the parallel concatenation of two (23, 35)$_8$ recursive systematic convolutional encoders separated by a random interleaver of size 2000 (or 3200) bits for R=½ (or ⅘). Hence, both codes generate 4000-bit codewords. Bit-by-bit Log-MAP decoding with 8 iterations is performed. Note that simulations for both Strategies 1 and 2 yielded similar performance (within 0.1 dB). Due to the negligible difference in performance, FIGS. 5A and 5B show the relationship between $\lceil$ and $\{P_f, P_b\}$ for the random subframing only, as it is easier to simulate (although more memory intensive to implement).

Another embodiment provides a subframing strategy for LDPC codes that requires no additional storage. The simplest subframing strategy, labeled as Strategy 3, involves allocating sets of N/$\eta$ contiguous bits in the frame to distinct subframes. Monte Carlo simulations for a randomly-constructed regular rate-R=½ systematic LDPC code of length N=4000 bits on the WC-AWGN-SE channel with sum-product decoding have shown that the average BER performance based on erasing each possible combination of $\alpha$ contiguous subframes obtained via Strategy 3 is almost indistinguishable from the BER performance obtained via random subframing. The similarity in performance for random subframing and strategy 3 is most likely due to the fact that the parity-check matrix implicitly provides a form of random interleaving by introducing dependencies between bits that are scattered throughout the codeword. Explicitly providing a random interleaver, as done in random subframing, thus is superfluous. Note that applying Strategy 3 to PCC codes results in worse performance as compared to random subframing due to the fact that the systematic and parity bits associated with the same data bit are simultaneously erased, which results in poor decoding performance.

For both PCC and LDPC codes, we observed that FER values $P_f > 1-R$ as well as values of $P_f < 1-R$, but near $1-R$ may not be corrected. As a nonlimiting example, for the considered rate—R=½ LDPC code, $P_f$=⅜ resulted in an asymptotic BER (BER obtained on the WC-AWGN-SE when $\sigma^2 \to 0$) of $10^{-2}$ with random subframing. This clearly indicates the existence of a cutoff value for the FER that can be corrected with asymptotically vanishing BER for a given LDPC code. If the FER is above the cutoff value, the lowest achievable BER is limited by a hard error floor. FIGS. 5A, 5B also shows $\lceil$ obtained with random subframing for the (4000, 2001) LDPC code and the (4095, 3367) Euclidean geometry LDPC code.

In practice, $\lceil (p/q, P_b)$ is simulated with a deterministic subframing pattern $S_q^p$ (determined with strategy 2 or 3) for various sets of integers $\{p, q\}$. Then, $\lceil (p/q, P_b)$ and $S_q^p$ are stored in a table (ROM) used in the SPU calibration to determine $P_{f,max}$. For each input $\{p, q, P_b\}$, the table outputs $\lceil (p/q, P_b)$ and $S_q^p$. By definition $P_{f,max}$ is the highest correctable FER with $\lceil_s$. However, practically, $P_{f,max}$ may be set as the maximum value of p/q (in the table) yielding $\lceil (p/q, P_b) \leq \lceil_s$. For example, given the limited set of simulated curves presented in FIG. 5, a system with $\{\lceil_s, P_b\}=\{6\text{ dB}, 10^{-5}\}$ that uses the LDPC (4000,2001) code has $P_{f,max}$=⅓. Similarly, a system with identical $\{\lceil_s, P_b\}$ but using the PCC(4000, 2000) code has $P_{f,max}$=⅜. The precision of $P_{f,max}$ obviously depends on the number of different FER's that have been simulated.

Figure 6:
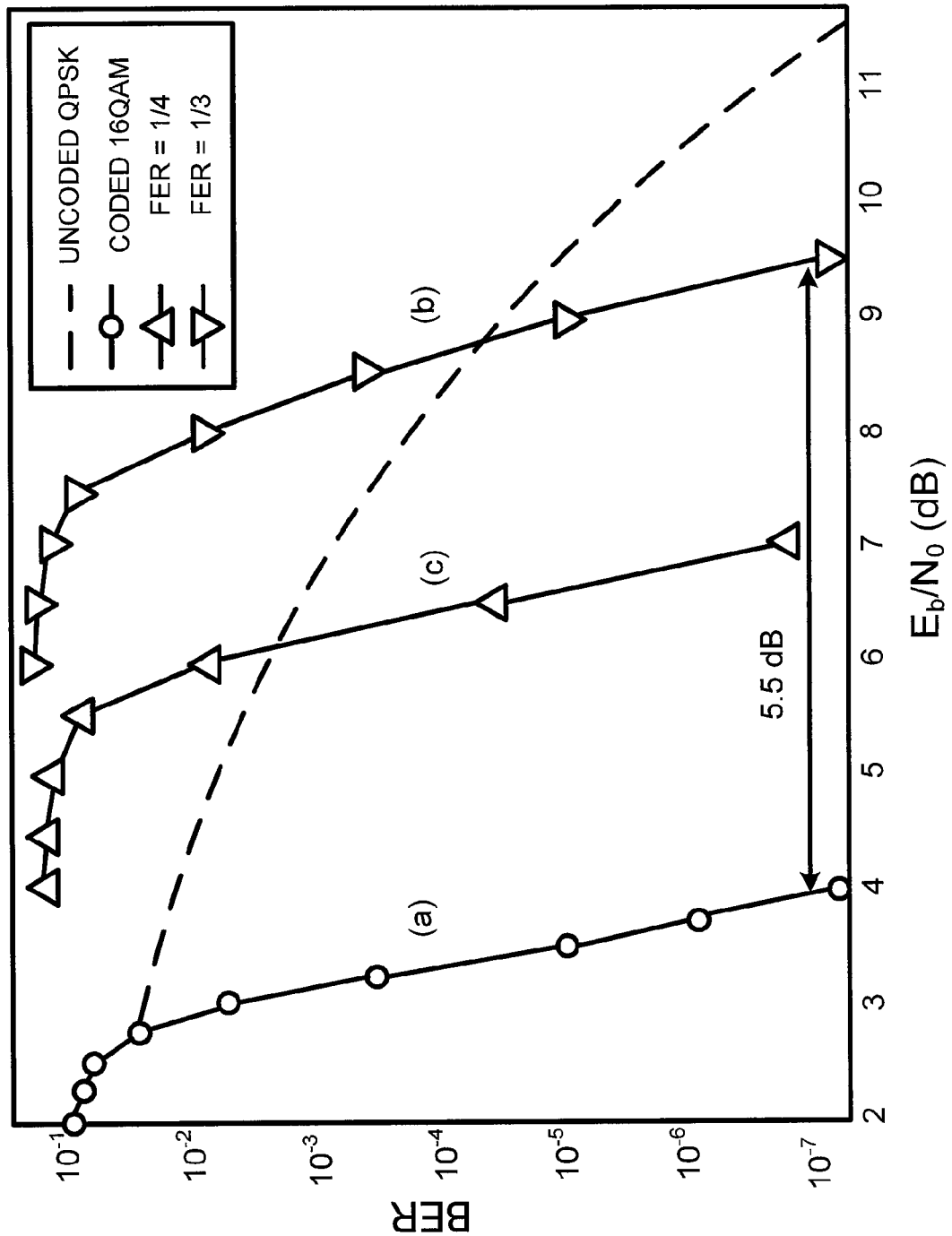
FIG. 6 is an exemplary embodiment of a plurality of Bit Error Rate (BER) curves versus power, similar to the diagram from FIGS. 5A and 5B.

FIG. 6 is an exemplary embodiment of a plurality of Bit Error Rate (BER) curves versus power, similar to the diagram from FIGS. 5A and 5B. The curve (a) of FIG. 6 represents the error performance over an AWGN channel of a rate R=½ turbo coded OFDM modulation scheme transmitting 4 coded bits per tone, where each tone is mapped to a 16-QAM signal set using Gray labeling. The turbocode is formed by the parallel concatenation of two 16-state recursive systematic convolutional encoder with generator polynomials (31, 27)$_8$ separated by a pseudo-random interleaver of length of 2052 bits.

For this specific example, we evaluated with Monte-Carlo simulations the performance degradation due to deleting (setting to zero) the metrics associated with a single corrupted symbol per turbo frame. For each simulated turbo frame, the location of the corrupted (i.e., deleted) symbol is chosen randomly with a uniform probability.

Following strategy 2, the curves (b) and (c) of FIG. 6 illustrate the BER performance degradation for $P_f$=⅓ and ¼, respectively. For $P_f$=⅓, a SNR gap of 5.5 dB between (a) and (b) is observed at $10^{-7}$ BER. Stated differently, assuming a SNR margin larger than 5.5 dB, it is possible to correct the turbo coded information with a BER lower than $10^{-7}$ if less than ⅓ of the turbo frame is corrupted by impulsive noise. For $P_f$=¼, the margin is reduced to about 3 dB.

The capability of correcting impulse events may depend on both the code characteristics and margin. The nonlimiting example above shows that for a specific code with rate R=½, the information can be corrected with 5.5 dB margin for turbo frames with less than ⅓ of the bits in a turbo frame are corrupted by impulsive noise. For the same code, the margin required to correct a corrupted symbol for $P_f$=½ becomes 13.5 dB. For $P_f$=1, since all the bits are corrupted, the code generally does not offer any protection against impulse noise.

Based on the observation that highly punctured turbo codes can maintain a target QoS (Quality of Service) with a few dB SNR margin, a self-protection method has been presented to protect TTCM-coded OFDM-based systems against non-stationary noise. Compared to classical systems, protecting all the data with a RS code, self-protected systems may have a reduced latency. As a nonlimiting example, a self-protection method may be used to reduce the latency of TTCM-coded VDSL-DMT systems while maintaining the standard INP requirements.

Various embodiments disclosed herein may be configured to provide efficient combinations of erasure-decoding and channel interleaving, called "self-protection" to correct a mixture of AWGN and burst-erasures, where the available SNR margin is used to reduce the transmission delay. Self-protection as discussed herein may involve increasing erasure correction capabilities per codeword by using subframing and, if necessary, reducing the number of erasures per codeword by interleaving several codewords together. Various memory-efficient subframing strategies for PCC and LDPC codes may be used that require reduced storage resources as compared to random subframing. More specifically, some embodiments of subframing strategies may be configured to provide similar performance to random subframing. Also, a realization of an interleaver device 206 is provided and may be configured to interleave large blocks of bits (called subframes) and may achieve, with a reduced storage capacity, and a latency at most equal to that of the classical convolutional channel interleavers. Simulation results demonstrate that the SNR margin required for maintaining a given quality of service (target BER and frame erasure rate) may be significantly lower for PCC codes compared to LDPC codes. Consequently, PCC codes may be utilized in self-protected OFDM systems.

Figure 7:
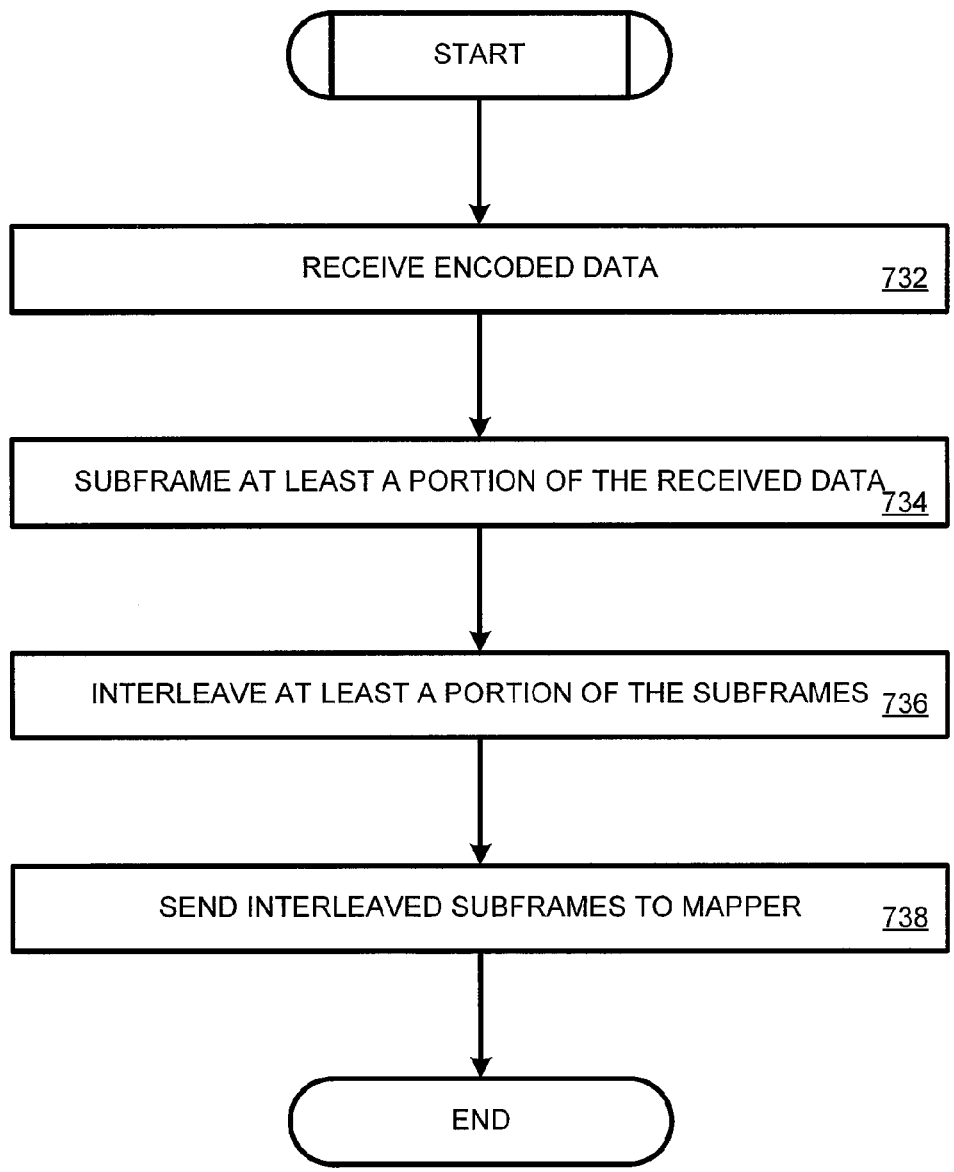
FIG. 7 is a flowchart illustrating an exemplary embodiment of a process that may be utilized in protecting a signal from impulse noise, such as may be utilized in the system from FIG. 2.

FIG. 7 is a flowchart illustrating an exemplary embodiment of a process that may be utilized in protecting a signal from impulse noise, such as may be utilized in the system from FIG. 2. More specifically, as illustrated in the nonlimiting example of FIG. 7, an SPU 200 can receive encoded data (block 732). The encoded data may be received from an encoder that is external from the SPU 200, however this is not a requirement. The SPU can then subframe at least a portion of the received data (block 734). More specifically, as discussed above, the SPU may include a subframer, which may be embodied in hardware, software, and/or firmware. The subframer may be configured to convert the received data, which may arrive as a plurality of frames, into subframes. The SPU 200 can then interleave at least a portion of the subframes (block 736). As discussed above, interleaving may take any of a plurality of different forms, but is generally performed at the subframe level. The SPU 200 can also send at least a portion of the subframed, interleaved data to a mapper (e.g., constellation mapper 210), as illustrated in block 938.

Figure 8:
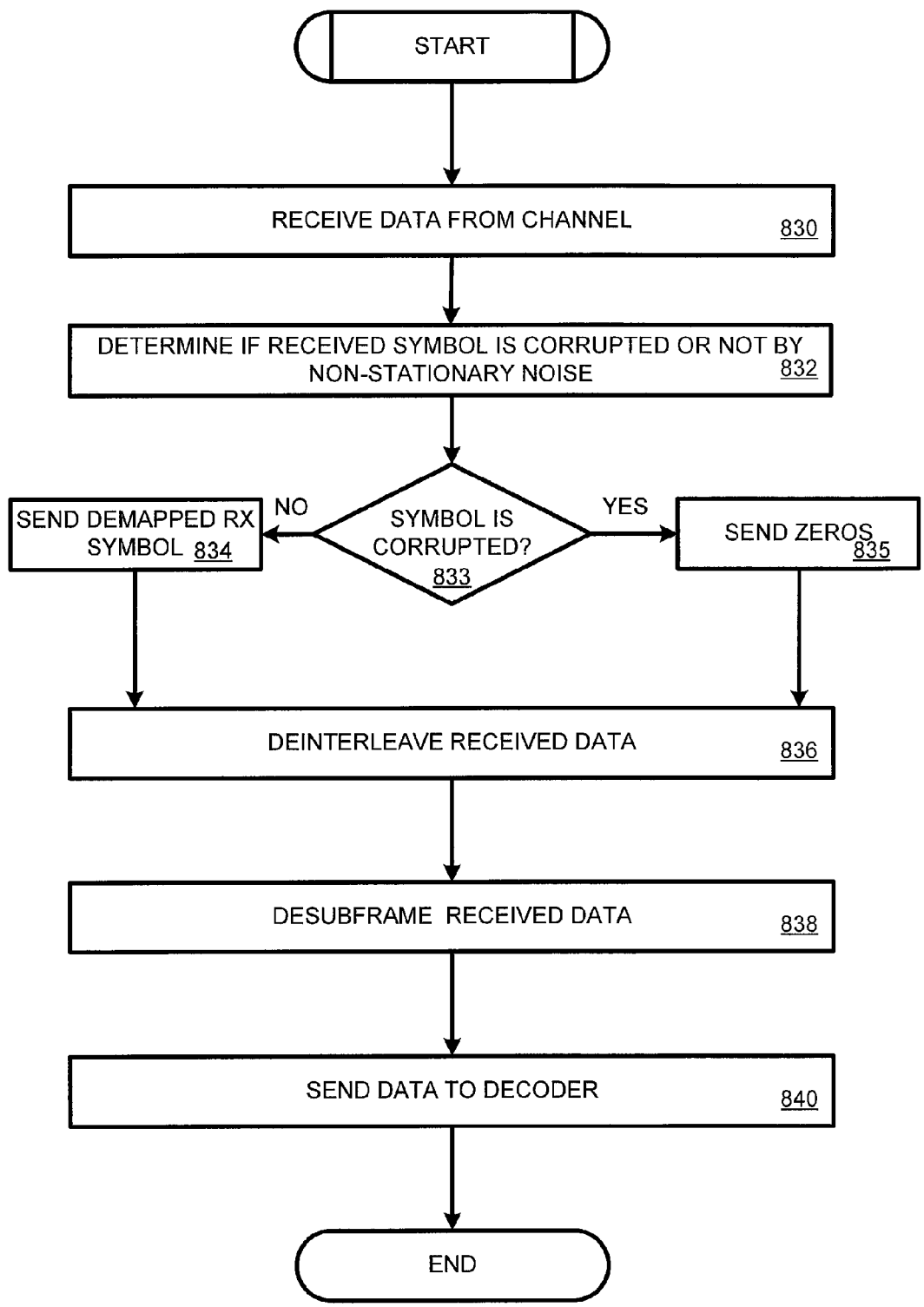
FIG. 8 is a flowchart illustrating an exemplary embodiment of a process that may be utilized in providing data to a decoder, similar to the flowchart from FIG. 7.

FIG. 8 is a flowchart illustrating an exemplary embodiment of a process that may be utilized in providing data to a decoder, similar to the flowchart from FIG. 7. As illustrated in the nonlimiting example of FIG. 8, the SPU 200 receives data from the channel 212 (block 830). The SPU 200 can then determine whether a received symbol is corrupted by non-stationary noise (block 832). As discussed above, data may be sent from the SPU 200 to a constellation mapper 210. The constellation mapper can map the data, as discussed above and send the mapped data to a channel 212, which can send the data to a constellation demapper 214, which can demap the data to be sent back to the SPU 200. The SPU can then determine via the symbol error detector 216 whether the received symbol is corrupted or not by non-stationary interference (block 834). If the symbol is corrupted (block 833), the SPU 200 can send zeros (block 835). If, at block 833, the symbol is not corrupted, the SPU 200 can send a demapped receive symbol (block 834). More specifically, as discussed above, the symbol error detector 216 can determine the location of a corrupted symbol and flags the symbol with a 0 (if not corrupted) or a 1 (if corrupted). If the symbol is corrupted, the subframe deinterleaver 218 inputs zeros instead of the received data from the demapper 214. Otherwise, the SPU 200 can deinterleave the received data from the demapper 214 via, for example, the subframe deinterleaver 218 (block 836). The SPU can desubframe the received data, via the desubframer (block 838). The SPU 200 can send the desubframed data to the decoder 222 (block 840).

Figure 9:
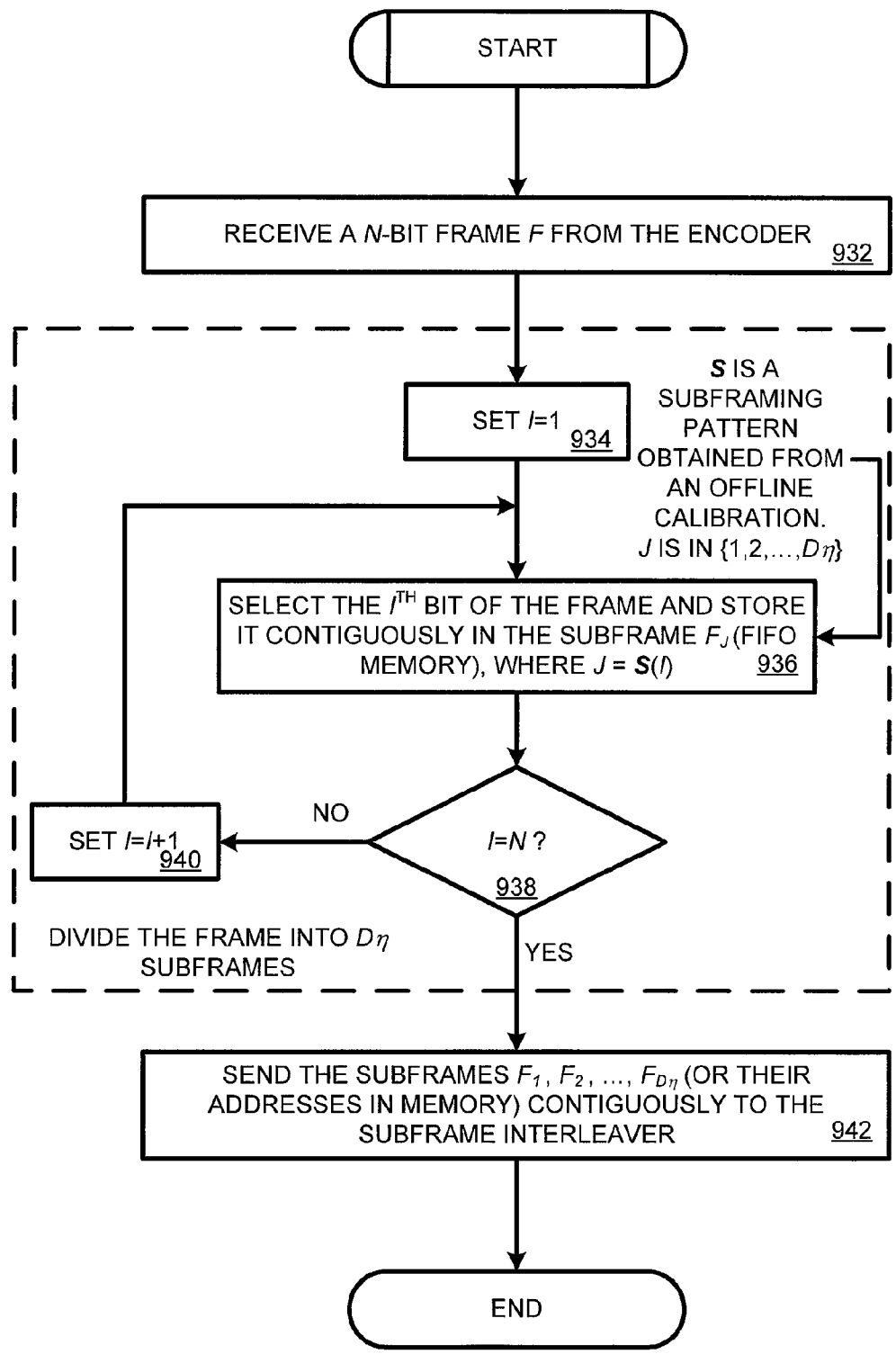
FIG. 9 is a flowchart illustrating an exemplary embodiment of a process that may be utilized in a subframer, such as the subframer from FIG. 2.

FIG. 9 is a flowchart illustrating an exemplary embodiment of a process that may be utilized in a subframer, such as the subframer from FIG. 2. As illustrated in the nonlimiting example of FIG. 9, the SPU 200 can receive an N-bit frame F from the encoder 202 (block 932). Upon receiving the frame, the SPU 200 can divide the frame into $D\eta$ subframes. More specifically, i can be set to 1 (block 934). The subframer 204 can then select the $i^{th}$ bit of the frame and store this bit contiguously in the subframe $F_j$ (FIFO memory) where j=S(i) (block 936). More specifically, S may be a subframing pattern obtained from an offline calibration. j may be a value in $\{1, 2, \ldots, D\eta\}$.

A determination can be made whether i equals N (block 938). If i does not equal N, the subframer can set i=i+1 (block 940) and the flowchart returns to block 936. If i equals N, the subframes $F_1, F_2, \ldots, F_{D\eta}$ (and/or addresses associated with these subframes) can be contiguously sent to the subframe interleaver 206.

Figure 10:
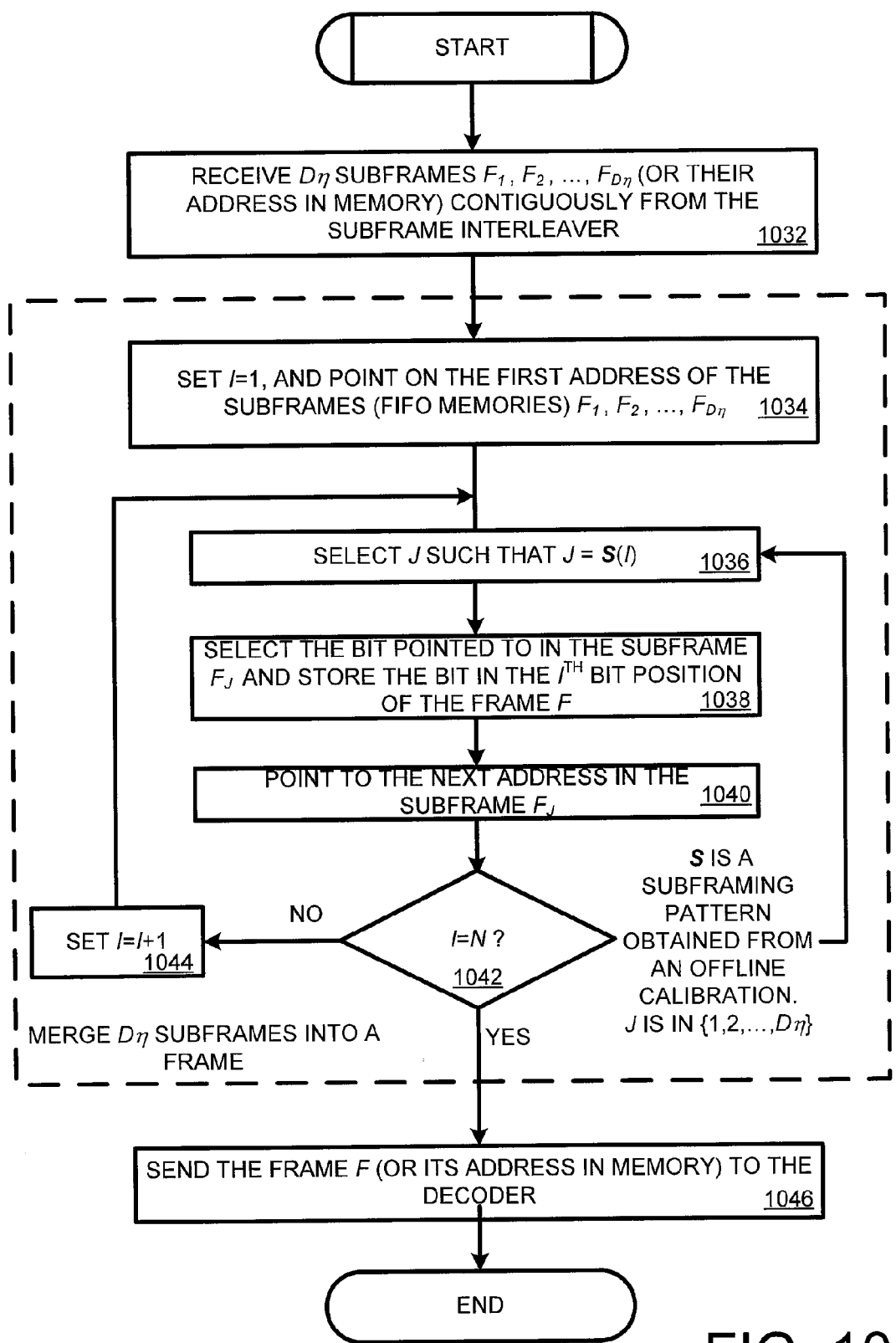
FIG. 10 is a flowchart illustrating an exemplary embodiment of a process that may be utilized in a desubframer, such as the desubframer from FIG. 2.

FIG. 10 is a flowchart illustrating an exemplary embodiment of a process that may be utilized in a desubframer, such as the desubframer from FIG. 2. As illustrated in the nonlimiting example of FIG. 10, the SPU can contiguously receive $D\eta$ subframes $F_1, F_2, \ldots F_{D\eta}$ (and/or memory addresses associated with these subframes) from the subframe interleaver 206 (block 1032). The desubframer 220 can then merge $D\eta$ subframes into a frame. More specifically, in at least one nonlimiting example, the desubframer 220 can set i equal to 1 and point to the first address of the subframes (FIFO memories) $F_1, F_2, \ldots F_{D\eta}$ (block 1034). The desubframer 220 can select j, such that j=s(i) (block 1036). More specifically, in at least one embodiment, s may be a subframing pattern obtained from the offline calibration component 208. j may be a value selected from $\{1, 2, \ldots, D\eta\}$. The desubframer 220 can then select the bit pointed in the subframe $F_j$ and store that bit in the $i^{th}$ bit position of the frame F (block 1038). The desubframer 220 can then point to the next address in the subframe $F_j$ (block 1040). The desubframer 220 can then determine whether i equals N (block 1042). If i does not equal N, the desubframer 220 set i=i+1 (block 1044) and the flowchart can return to block 1036. If i does equal N, the frame (and/or an address in memory) can be sent to the decoder 222 (block 1046).

Figure 11:
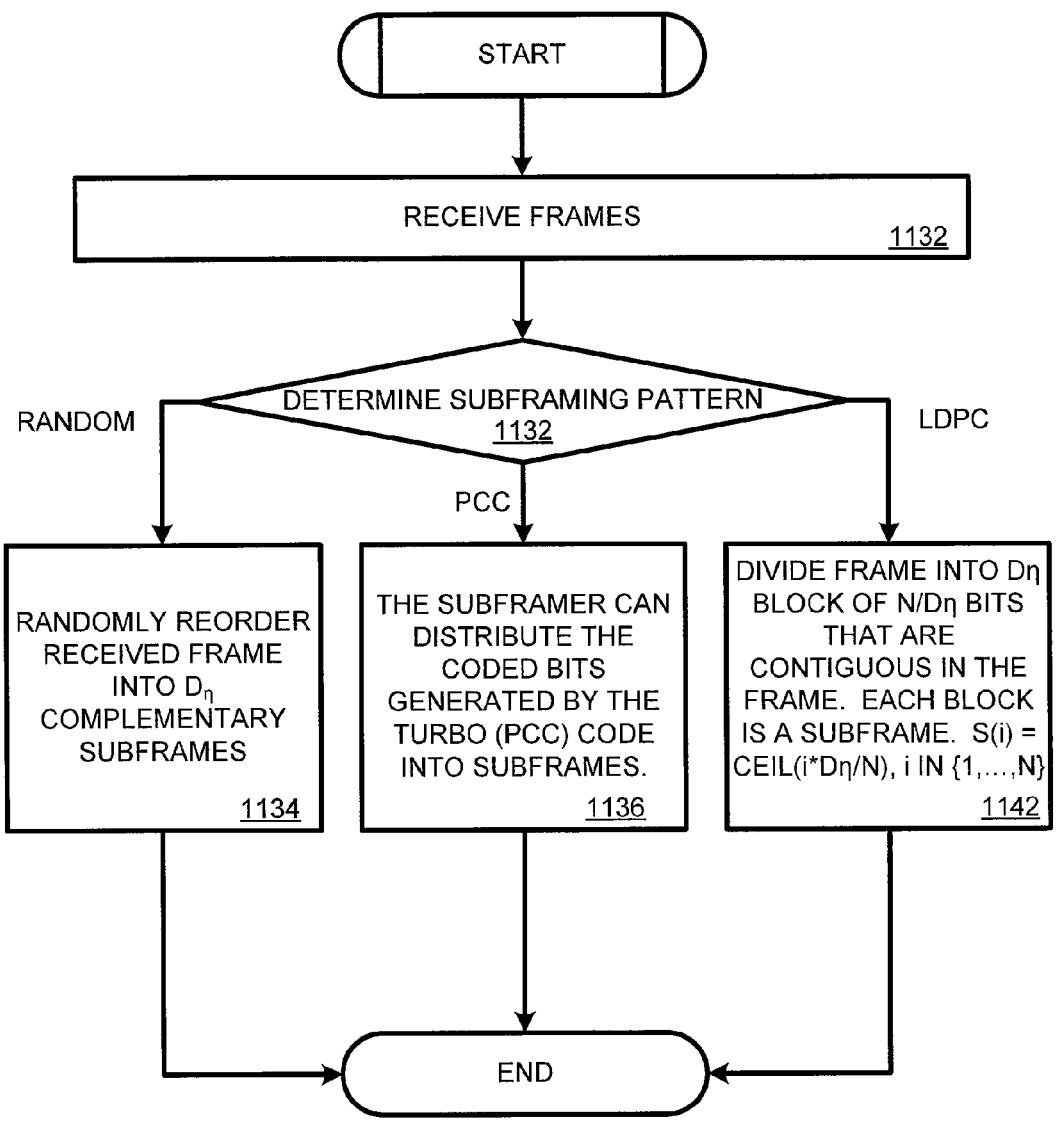
FIG. 11 is a flowchart illustrating an exemplary embodiment of a process that may be utilized for determining subframing strategies, similar to the flowchart from FIG. 10.

FIG. 11 is a flowchart illustrating an exemplary embodiment of a process that may be utilized for determining subframing strategies, similar to the flowchart from FIG. 10. As illustrated in the nonlimiting example of FIG. 11, the subframer 204 can receive frames from an encoder 202 (block 1132). The subframer can then determine a subframing pattern (block 1132). If a random pattern is determined, the subframer 204 can randomly order bits of the received frame into $D\eta$ complementary subframes (block 1134).

If, at block 1132, a PCC pattern that might be used for a PCC code is determined, the subframer 204 can distribute the coded bits (systematic, parity, and interleaved parity bits) generated by the turbo (PCC) code into subframes (block 1136). First, the subframer 204 can distribute the coded bits (systematic, parity, and interleaved parity bits) generated by the same data bit into different subframes (if possible). Second, the distribution may be completed such that all subframes contain the same (or close to the same) number of systematic bits. This second point applies similarly for parity and interleaved parity bits. Third, for each coded sequence, the systematic bits allocated to the same subframe may be scattered in the original ordering. In other words, systematic bits that are contiguous in the original ordering may be distributed to different subframes (if possible. This third point applies similarly for parity and interleaved parity bits.

If, at block 1132, an LDPC pattern that might be used for an LDPC code is determined, the subframer can divide the frame into $D\eta$ blocks of $N/D\eta$ bits that are contiguous in the frame. Each block may be a subframe. Similarly, the subframing pattern may be given by S(i)=ceil(i*$D\eta$/N), for i an integer in $\{1, \ldots, N\}$ (block 1142).

Figure 12:
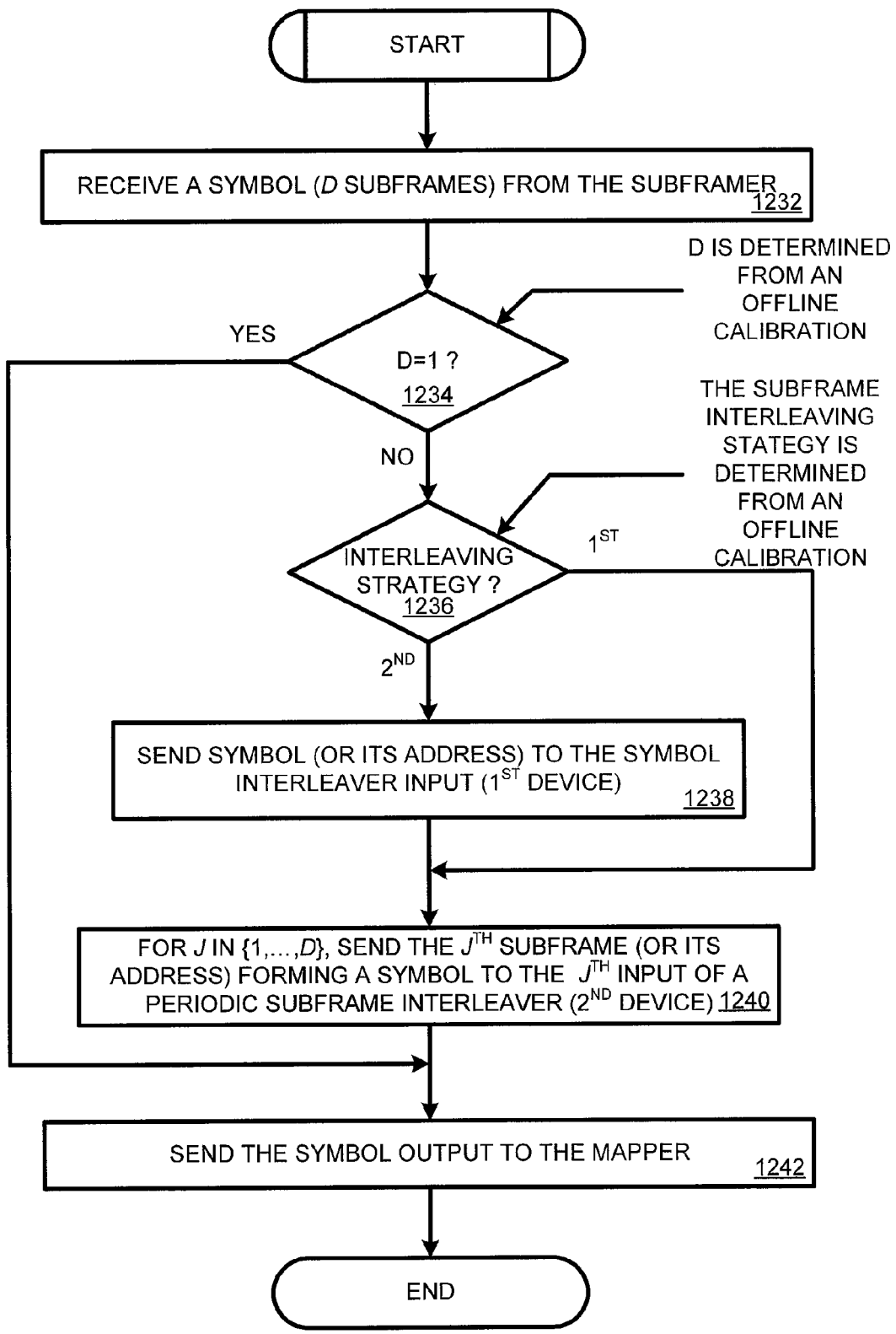
FIG. 12 is a flowchart illustrating an exemplary embodiment of a process that may be utilized in a subframe interleaver, such as the subframe interleaver from FIG. 2.

FIG. 12 is a flowchart illustrating an exemplary embodiment of a process that may be utilized in a subframe interleaver, such as the subframe interleaver from FIG. 2. As illustrated in the nonlimiting example of FIG. 12, the subframe interleaver 206 can receive a symbol (D subframes) from the subframer 204 (block 1232). The subframe interleaver 206 can then determine whether D=1 (block 1234). More specifically, D may be determined from an offline calibration. If D is equal to 1, the flowchart can proceed to block 1242, described below. If D is not equal to 1, the subframe interleaver 206 can determine an interleaving strategy (block 1236). Again, in at least one nonlimiting example, the subframe interleaving strategy may be determined from an offline calibration. If the first strategy is determined (described above), the flowchart may proceed to block 1240. If the second strategy is determined, the subframe interleaver can send a symbol (and/or an address associated with the symbol) to the symbol interleaver input ($1^{st}$ device 324a of FIG. 3A), as illustrated in block 1238. For J in $\{1, \ldots, D\}$, the subframe interleaver can send the $j^{th}$ subframe (and/or an address associated with the subframe) forming a symbol to the $j^{th}$ input of a periodic subframe interleaver ($2^{nd}$ device 326a of FIG. 3A), as illustrated in block 1240. The subframe interleaver can then send the symbol output to the mapper 210 (block 1242).

Figure 13:
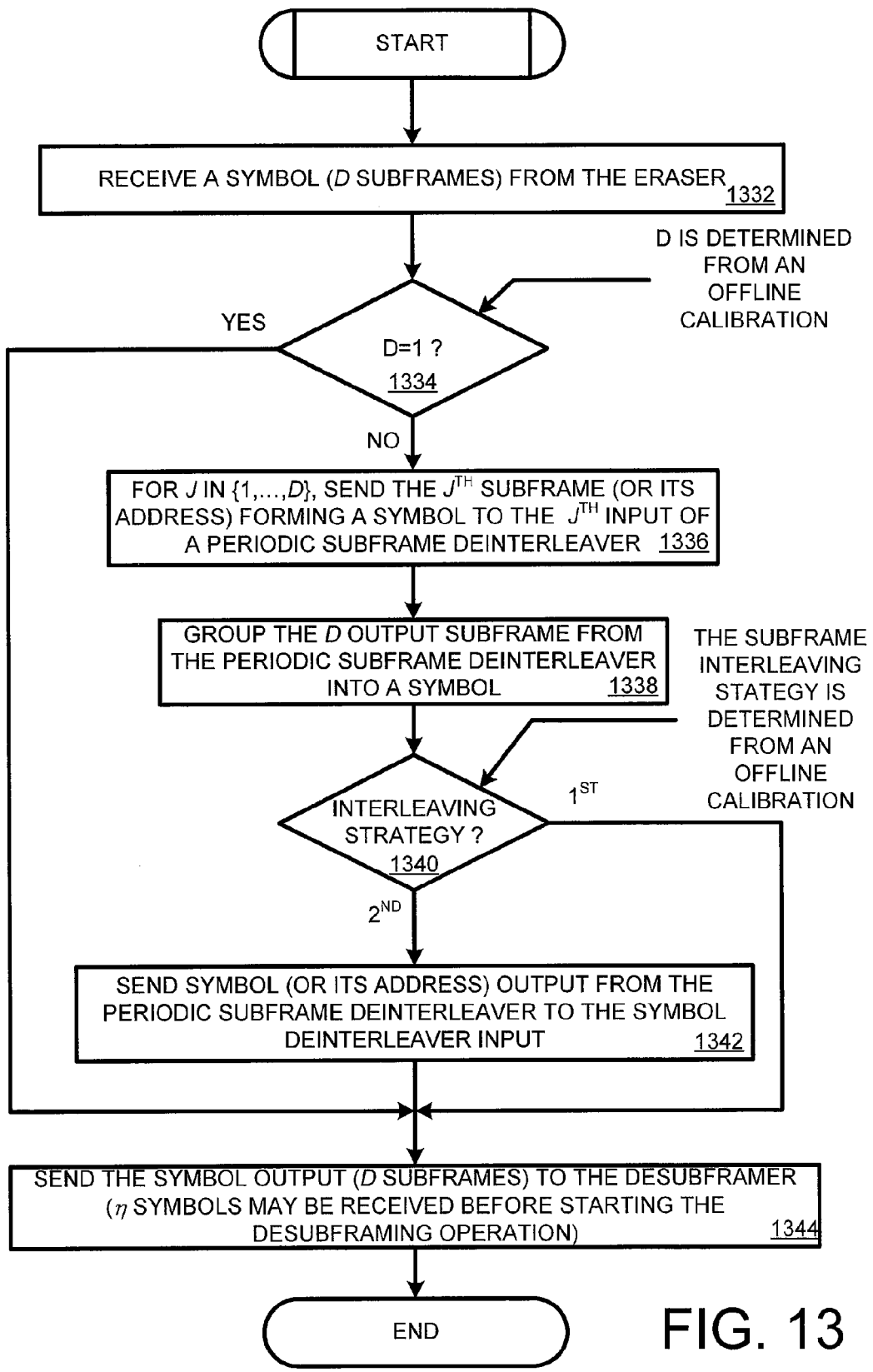
FIG. 13 is a flowchart illustrating an exemplary embodiment of a process that may be utilized in a subframe deinterleaver, such as the subframe deinterleaver from FIG. 2.

FIG. 13 is a flowchart illustrating an exemplary embodiment of a process that may be utilized in a subframe deinterleaver, such as the subframe deinterleaver from FIG. 2. As illustrated in the nonlimiting example of FIG. 13, the SPU 200 can receive a symbol (D subframes) from the eraser 217 (block 1332). The subframe deinterleaver 324b, 326b can then determine whether D equals 1 (block 1334), where in at least one embodiment, D is determined form an offline calibration. If D equals 1, the flowchart can proceed to block 1344. If D does not equal 1, for j in $\{1, \ldots, D\}$, the $j^{th}$ subframe (and/or an address associated with the subframe) forming a symbol can be sent to the $j^{th}$ input of the periodic subframe deinterleaver 326b (block 1336). The SPU 200 can group the D output subframes from the periodic subframe deinterleaver 326b into a symbol (block 1338). The interleaving strategy can be checked (block 1340). As discussed above, the subframe interleaving strategy may be determined from an offline calibration. If the first subframe interleaving strategy has been used on the transmitter, the flowchart proceeds to block 1344. If the second subframe interleaving strategy has been used on the transmitter, the periodic subframe deinterleaver 326b can send a symbol (and/or an address associated with the symbol) to the input of the symbol deinterleaver 234b (block 1342). The symbol deinterleaver 324b can then send the symbol output (D subframes) to the desubframer, where η symbols may be received before starting the desubframing operation (block 1344).

The embodiments disclosed herein can be implemented in hardware, software, firmware, or a combination thereof. At least one embodiment disclosed herein may be implemented in software and/or firmware that is stored in a memory and that is executed by a suitable instruction execution system. If implemented in hardware, one or more of the embodiments disclosed herein can be implemented with any or a combination of the following technologies: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

One should note that the flowcharts included herein show the architecture, functionality, and operation of a possible implementation of software. In this regard, each block can be interpreted to represent a module, segment, or portion of code, which comprises one or more executable instructions for implementing the specified logical function(s). It should also be noted that in some alternative implementations, the functions noted in the blocks may occur out of the order and/or not at all. For example, two blocks shown in succession may in fact be executed substantially concurrently or the blocks may sometimes be executed in the reverse order, depending upon the operations involved.

One should note that any of the programs listed herein, which can include an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, or transport the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium could include an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). In addition, the scope of the certain embodiments of this disclosure can include embodying the operations described in logic embodied in hardware or software-configured mediums.

Additionally, embodiments discussed herein may be implemented in (and/or associated with) one or more different devices. More specifically, depending on the particular configuration, operations discussed herein may be implemented in a set-top box, a satellite system, a television, a portable appliance, a gaming unit, a personal computer, an MP3 player, an IPOD® player, a cellular telephone, a wireless communication receiver, a Digital Subscriber Line (DSL) modem, a wireline communication system and/or other devices.

One should also note that conditional language, such as, among others, "can," "could", "might", or "may", unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment. Additionally, use of the term "receive", "receiving", "received", and other similar terms is not intended to limit the disclosure to actions taken at an input port and/or output port. Depending on the particular embodiment, the term "receive" (as well as variations thereof) may be interpreted to include internal and/or external communication of data.

It should be emphasized that the above-described embodiments are merely possible examples of implementations, merely set forth for a clear understanding of the principles of this disclosure. Many variations and modifications may be made to the above-described embodiment(s) without departing substantially from the spirit and principles of the disclosure. All such modifications and variations are intended to be included herein within the scope of this disclosure.

Therefore, at least the following is claimed:

1. A subframe interleaver, comprising:
   a receiving component that receives a predetermined number of subframes, the predetermined number of subframes being derived from a plurality of frames of data, where the predetermined number is determined from an offline calibration;
   a first determining component that determines whether a total number of received subframes does not meet a predetermined threshold; and
   an interspersing component that, in response to determining that the total number of received subframes does not meet the predetermined threshold, intersperses at least a portion of the at least one subframe according to a subframe interleaving strategy determined from the offline calibration.

2. The subframe interleaver of claim 1, further comprising a periodic subframe interleaver input device that forms a symbol associated with an output.

3. The subframe interleaver of claim 1, further comprising a symbol interleaver device that sends data associated with a symbol.

4. The subframe interleaver of claim 3, wherein data associated with a symbol includes at least one of the following: the symbol and memory address of the symbol.

5. The subframe interleaver of claim 1, further comprising an output component that sends the interspersed subframes to a mapper component.

6. The subframe interleaver of claim 5, wherein the output component further, in response to a determination that the total number of received subframes meets the predetermined threshold, sends the received subframe to a mapper component.

7. The subframe interleaver of claim 1, wherein the subframe interleaver is configured for implementation with at least one of the following: a set-top box, a television, a portable appliance, a gaming unit, a satellite system, an MP3 player, an IPOD® player, a cellular telephone, a wireless communications device, a Digital Subscriber Line (DSL) modem, and a wireless communications device.

8. A method for subframe interleaving, comprising:
   receiving, by a computer, a predetermined number of subframes, the predetermined number of subframes being derived from a plurality of frames of data, where the predetermined number is determined from an offline calibration; and
   in response to a determination that a total number of received subframes does not meet a predetermined threshold, interspersing at least a portion of the at least one subframe according to a subframe interleaving strategy determined from the offline calibration.

9. The method of claim 8, further comprising determining whether to execute a first subframe interleaving strategy, the first subframe interleaving strategy including forming a symbol associated with an output of a periodic subframe interleaver input device.

10. The method of claim 8, further comprising determining whether to execute a second subframe interleaving strategy, the second subframe interleaving strategy including:
    sending a data associated with a symbol to a symbol interleaver device; and
    forming a symbol associated with an output of a periodic subframe interleaver input device.

11. The method of claim 10, wherein data associated with a symbol includes at least one of the following: the symbol and memory address of the symbol.

12. The method of claim 8, further comprising sending the interspersed subframes to a mapper component.

13. The method of claim 8, wherein at least a portion of the method is performed in at least one of the following: a set-top box, a television, a portable appliance, a gaming unit, a satellite system, an MP3 player, an IPOD® player, a cellular telephone, a wireline communications device, a Digital Subscriber Line (DSL) modem, and a wireless communications device.

14. A system for subframe interleaving, comprising:
    means for receiving a predetermined number of subframes, the predetermined number of subframes being derived from a plurality of frames of data, where the predetermined number is determined from an offline calibration; and
    means for, in response to a determination that a total number received subframes does not meet a predetermined threshold, interspersing at least a portion of the at least one subframe according to a subframe interleaving strategy determined from the offline calibration.

15. The system of claim 14, further comprising means for determining whether to execute a first subframe interleaving strategy, the first subframe interleaving strategy including forming a symbol associated with an output of a periodic subframe interleaver input device.

16. The system of claim 14, further comprising means for determining whether to execute a second subframe interleaving strategy, the second subframe interleaving strategy including:
    sending a data associated with a symbol to a symbol interleaver device; and
    forming a symbol associated with an output of a periodic subframe interleaver input device.

17. The system of claim 16, wherein data associated with a symbol includes at least one of the following: the symbol and memory address of the symbol.

18. The system of claim 14, further comprising means for sending the interspersed subframes to a mapper component.

19. The system of claim 14, wherein at least a portion of the system is configured for operation with at least one of the following: a set-top box, a television, a portable appliance, a gaming unit, a satellite system, an MP3 player, an IPOD® player, a cellular telephone, a wireline communications device, a Digital Subscriber Line (DSL) modem, and a wireless communications device.

* * * * *

UNITED STATES PATENT AND TRADEMARK OFFICE
CERTIFICATE OF CORRECTION

PATENT NO. : 8,032,800 B2
APPLICATION NO. : 11/617028
DATED : October 4, 2011
INVENTOR(S) : Pons et al.

Page 1 of 1

It is certified that error appears in the above-identified patent and that said Letters Patent is hereby corrected as shown below:

On the title page, in the Figure, below Box "1232", Line 7,
delete "STATEGY IS" and insert -- STRATEGY IS --, therefor.

In Fig. 12, Sheet 12 of 13, below Box "1232", Line 7,
delete "STATEGY IS" and insert -- STRATEGY IS --, therefor.

In Fig. 13, Sheet 13 of 13, below Box "1332", Line 7,
delete "STATEGY IS" and insert -- STRATEGY IS --, therefor.

In Column 3, Line 29, delete "$X_k$" and insert -- $x_k$ --, therefor.

In Column 8, Line 1, delete "$S_{D\eta}^{\alpha}$" and insert -- $s_{D\eta}^{1}$ --, therefor.

In Column 8, Line 39, delete "cyclically," and insert -- cyclically --, therefor.

In Column 8, Line 49, delete "($\sigma_2$)" and insert -- ($\sigma^2$) --, therefor.

In Column 13, Line 63, delete "calibration." and insert -- calibration --, therefor.

In Column 18, Lines 26-27, in Claim 14, delete "number received" and
insert -- number of received --, therefor.

Signed and Sealed this
Twelfth Day of February, 2013

Teresa Stanek Rea
*Acting Director of the United States Patent and Trademark Office*